United States Patent [19]

Neidorff

[11] Patent Number: 4,899,064
[45] Date of Patent: Feb. 6, 1990

[54] ABSOLUTE VALUE DIFFERENTIAL AMPLIFIER

[75] Inventor: Robert A. Neidorff, Bedford, N.H.

[73] Assignee: Unitrode Corporation, Lexington, Mass.

[21] Appl. No.: 201,476

[22] Filed: Jun. 1, 1988

[51] Int. Cl.$^4$ ............................................. H03K 5/00
[52] U.S. Cl. ...................................... 307/261; 328/26; 363/127
[58] Field of Search .......................... 307/261; 328/26; 329/166; 363/127

[56] References Cited

U.S. PATENT DOCUMENTS 4,575,643  3/1986  Sakai ................................... 328/26 X
4,663,544  5/1987  Flora et al. ......................... 328/26 X

FOREIGN PATENT DOCUMENTS 116878  7/1984  Japan ..................................... 330/258

OTHER PUBLICATIONS

"Linear Applications Databook", National Semiconductor Corporation, 1986, pp. iii, iv, 80, 91, & 92.

Primary Examiner—James B. Mullins
Attorney, Agent, or Firm—Weingarten, Schurgin, Gagnebin & Hayes

[57] ABSTRACT

A high speed analog amplifier having a differential input and provides a single output signal which corresponds to the absolute value of the input voltage. Furthermore, the amplifier provides a selectable output offset voltage which is proportional to a selected reference voltage. Moreover, the reference voltage alone is sufficient to operate the amplifier, eliminating additional power supply connections.

11 Claims, 1 Drawing Sheet

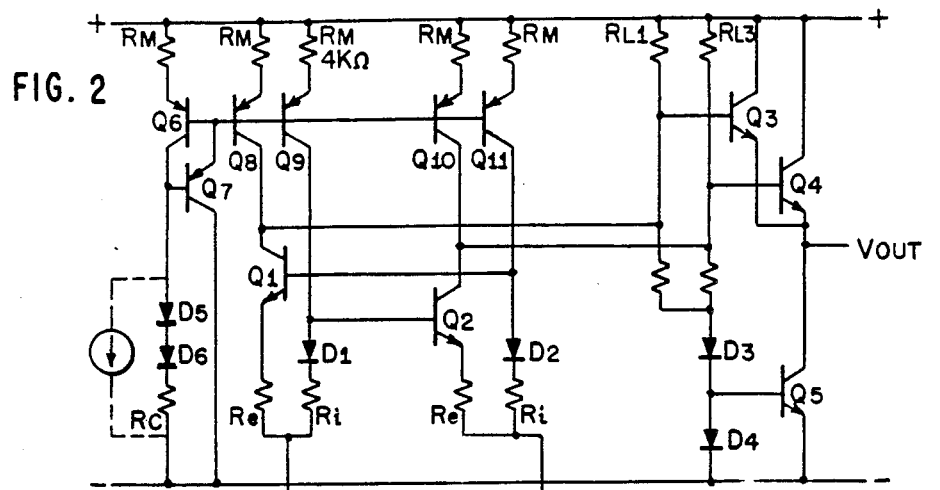
FIG. 2
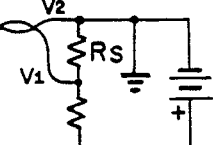
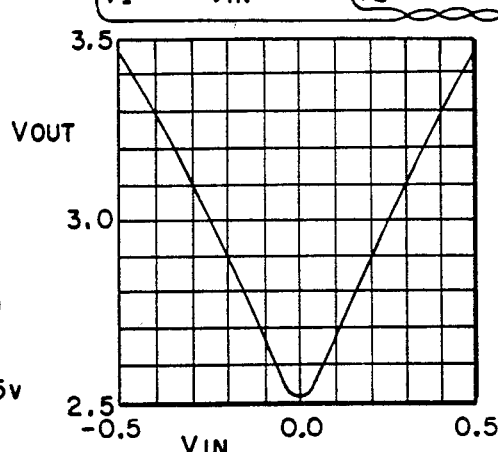
FIG. 3
VREF = 5v
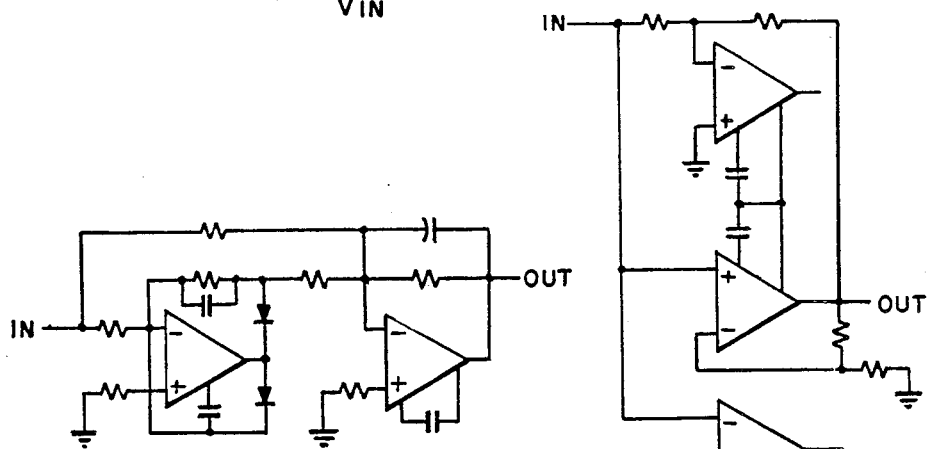
FIG. 1A
PRIOR ART
FIG. 1B
PRIOR ART ic value="4,899,064" -->

ABSOLUTE VALUE DIFFERENTIAL AMPLIFIER

FIELD OF THE INVENTION

The present invention relates to absolute value amplifiers, in particular high speed absolute value amplifiers for implementation in integrated circuits.

BACKGROUND OF THE INVENTION

Absolute value amplifiers, for use in servo control applications have previously been implemented by using separate amplifiers included in a topology having negative feed back, and universally suffered from slow response to the input signals caused by the complicated circuit topology and low slew rate amplifiers. For instance, typical prior art absolute value circuits are shown in FIGS. 1A and 1B which each includes two separate integrated circuit amplifiers and external components in amplifier topologies. Both prior art circuits have limited speed of response to the input signal and slew rate as a result of the compensation requirements of the negative feedback systems and because the high gain operational amplifiers typically require the use of slow PNP transistors in the forward gain path.

BRIEF DESCRIPTION OF THE PRESENT INVENTION

The present invention provides a high speed analog circuit with two inputs and one output operable without feedback to provide the absolute value of the input voltage expressed across the two inputs as an output voltage having a voltage gain, A. Moreover, the present invention provides a selected voltage offset which is determined according to a predetermined fraction of a reference voltage. Furthermore, the present invention is entirely operable from the power supplied by the reference voltage, avoiding the necessity of a separate circuit power connection. The circuit of the present invention achieves rapid response and high slew rate by incorporating semiconductors and a topology which avoids the requirement of slow PNP transistors.

BRIEF DESCRIPTION OF THE DRAWINGS

These and further features of the drawing will be further understood by reading the following detailed description, taken together with the drawing wherein:
FIGS. 1A and 1B are prior art absolute value circuits;
FIG. 2 is one embodiment of the present invention; and
FIG. 3 is a graph showing the transfer function of one embodiment of the present invention.

DETAILED DESCRIPTION OF THE INVENTION

One embodiment of the high speed analog absolute value amplifier of the present invention is shown in FIG. 2 having two inputs, V1 and V2 and output Vout, connected to a reference voltage Vref. The amplifier has the following transfer:

$$Vout = 0.5\ Vref + A\ Abs\ (V2 - V1) \qquad (1)$$

where Vref is an arbitray reference potential, A is a selected voltage gain of the amplifier, and V1 and V2 are input terminals across which the input signal is applied. The Abs represents an absolute value function.

One embodiment of the present invention is shown in FIG. 2, wherein the input terminals V1 and V2 receive an input voltage, which maybe generated at a distance from the amplifier by a current flowing through a resistor RS which is variable according to the particular activity measured, or from transducers, and connected to the amplifier by a twisted pair wire or other suitable means of conveying the signal developed across RS. The input transistors Q1 and Q2 receive the input signals through resistors RE and RI and diodes D1 and D2, wherein each of the transistors Q1 and Q2 becomes conductive for opposite polarities of the input signal. The value of each resistor RE and RI in the embodiment shown in FIG. 2 is 4K ohms. A current flow is provided to the collector of transistors Q1 and Q2 by current source transistors Q8 and Q10, respectively. Transistors Q8 and Q10, as well as transistors Q9 and Q11 which provide a current flow through diodes D1 and D2 comprise matched current sources. The current sources are controlled by a signal provided by transistors Q6 and Q7 which are made conductive by a current flowing through a resistor RC and exemplary diodes D5 and D6, where diodes D5 and D6 represent one or more diodes as required to provide a low temperature compensation gain of the present circuit. The value of RC in the present embodiment is 20K ohms. Alternately, diodes D5 and D6 and RC may be replaced with a constant current source. Resistors RM are included in the emitter lead connections of the matched current sources and the current mirror including transistors Q6–Q11, having a value of 4K ohms, in the present embodiment.

The signals provided at the collectors of transistors Q1 and Q2 are connected to output resistors and output amplifiers Q3 and Q4. The collector of transistor Q1 is connected to output resistors RL1 and RL2, and the collector of transistor Q2 is connected to output RL3 and RL4, wherein the pair of resistors associated with each input transistor collector forms a voltage divider which determines the portion of the Vref which serves as the output voltage Vout is offset from the ground.

The gain of the amplifier is set by the ratio of the emitter resistors of transistors Q1 and Q2, and the load resistance of the respected transistors. Specifically, as the output signal appears across the parallel combination of two load resistors, RL1, RL2 and RL3, RL4, the gain is approximately to $$AV \approx RL/2\ RE \qquad (2)$$

where RL is one output resistor and RE is one input emitter resistor. In the embodiment shown in FIG. 2, the values of resistors RE and RI are 4K and 18K ohms, respectively. The exact gain can be found by substituting the exact input resistance for RE and exact output resistance for 0.5 RL, in the present embodiment. The exact input resistance is equal to one input emitter resistor RE plus the source resistance plus the emitter impedance of one input transistor. The exact output resistance is the parallel combination of the two output resistors, the input resistance of one emitter follower (Q3, Q4) and the collector resistance of one input transistor. The major source of error in computing the value of gain is due to the input transistor emitter impedance wherein the gain may be more accurately expressed as:

$$AV = \frac{0.5\ q\ RL\ Ie}{q\ RE\ Ie + KT} \qquad (3)$$

where K is Boltzman's constant, q is the charge on an electron, Ie is the current in the emitter of one input transistor, and T is temperature Kelvin. The effects of the kT/qIe term are minimized by matching the temperature coefficient to that of RE and RL. The temperature coefficient is matched by selecting the temperature coefficient of Ie so that the gain (3) is made to have substantially zero temperature drift. Therefore, the correct temperature dependence for Ie is found by equations 4 and 5:

$$\frac{q\,d\,(Ie\,RI)}{dT} = \frac{K\,dT}{dT}; \text{ or} \tag{4}$$

$$\frac{dIe}{dT} = \frac{Ie^2}{T}\left[\frac{1}{Ie} - \frac{q}{K}\frac{dRe}{dT}\right] \tag{5}$$

therefore, the topology and resistances of the embodiment of FIG. 2, illustrates the proper selection of component values for temperature independent operation of the circuit according to the present invention, when used with a Vref of five volts.

The signals at the collectors of transistors Q1 and Q2 are received by the bases of transistors of Q3 and Q4, respectively, having commonly connected collectors and emitters. The emitters are collected to the the collector of transistor Q5 which is biased by diodes D3 and D4 and the load resistors to provide the output voltage Vout at the emitters of the transistors Q3 and Q4. Therefore, the embodiment of the present invention shown in FIG. 2 provides a transfer function shown in FIG. 3, wherein an offset of 2.5 volts (½ Vref) is provided such that a zero (0) input voltage results in a +2.5 volt Vout signal, and a gain approximately equal to two times the absolute value of the input signal.

Modifications and substitutions of the present invention made by one of ordinary skill in the art is within the scope of the present invention. For instance, alternative circuits can be used to approximate the current Ie, depending on power supply voltages, and the characteristics of the temperature drift of the resistors and characteristics of the transistors being used. Moreover, the current provided by the matched current sources through resistor RI may differ from the current through the collectors of transistors Q1 and Q2. Furthermore, while the embodiment shown probably incorporates NPN transistors due to their presently superior characteristics to PNP characteristics, the present invention envisions embodiment and the topology having PNP transistors as maybe substituted by one of ordinary skill in the art. Therefore, the present invention is not limited except by the claims which follow.

What is claimed is:

1. An absolute value amplifier, comprising:
a first and a second input transistor connected to receive an input signal and each having a corresponding output signal;
a current source connected to said first and said second transistors providing an equal flow of current through each of said first and said second transistors, wherein
said first and said second transistors are responsive to opposite polarity of said input signal;
a first and second output means coupled to receive the output signals of said first and said second transistor and having a common connected output providing an amplifier output corresponding to the absolute value of said input signal.

2. The absolute value amplifier of claim 1, wherein said first and second output means comprise transistors having emitters connected together.

3. The absolute value amplifier of claim 1, wherein said first and second transistors are connected to provide a differential input, said input signal being applied thereacross.

4. The absolute value amplifier of claim 3, further including
a diode connected to each input transistor each receiving said input signal therethrough and each being biased on by said current source.

5. The absolute value amplifier of claim 4, wherein the current provided by said current source to said first and second diodes is the same as provided to said first and second input transistors.

6. The absolute value amplifier of claim 5, wherein each said first and second input transistor is connected to an emitter resistor and a load resistor, the gain of provided by said input amplifier being proportional to the ratio of the effective load resistance to the effective emitter resistance.

7. The absolute value amplifier of claim 6, further including
means for providing an output signal offset, wherein said amplifier output signal is responsive to the signal plus a selected offset value.

8. The absolute value amplifier of claim 7, wherein said means for providing an offset comprises a resistor divider network connected to the collector of each input transistor.

9. The absolute value amplifier of claim 1, wherein said input transistors and said output means comprises NPN transistors.

10. The absolute value amplifier of claim 1, wherein the temperature dependence of at least one of said input transistors is:

$$\frac{dIe}{dT} = \frac{Ie^2}{T}\left[\frac{1}{Ie} - \frac{q}{K}\frac{dRE}{dT}\right]$$

11. An absolute value amplifier, comprising:
a first diode having a first region comprising one of an anode and a cathode connected to receive a first input signal;
a first input transistor having an emitter region connected to receive said first input signal;
a second diode having a first region comprising one of an anode and a cathode connected to receive a second input signal;
a second input transistor having an emitter region connected to receive said second input signal, wherein
said first input transistor includes a base region connected to a second region of said second diode comprising the other of said anode and said cathode of said second diode,
said second input transistor includes a base region connected to a second region of said first diode comprising the other of said anode and said cathode of said first diode;
means for providing substantially identical plural flows of constant current, wherein a separate flow of current is connected to a first input transistor collector region, a second transistor collector region, said second region of said first diode and said second region of said second diode;
a first output transistor having a base region connected to said first input transistor collector region; and
a second output transistor having a base region connected to said second input transistor collector region, wherein
said first and said second output transistors have common connected regions providing an output signal according to the absolute value of the difference of said first and second input signals.

* * * * *

UNITED STATES PATENT AND TRADEMARK OFFICE
CERTIFICATE OF CORRECTION

PATENT NO. : 4,899,064
DATED : February 6, 1990
INVENTOR(S) : Robert A. Neidorff It is certified that error appears in the above-identified patent and that said Letters Patent is hereby corrected as shown below:

In Column 2, line 65, "0.5 a RL Ie" should read
--0.5 q RL Ie--.

Signed and Sealed this

Twenty-eighth Day of July, 1992

Attest:

DOUGLAS B. COMER

Attesting Officer

Acting Commissioner of Patents and Trademarks